United States Patent
Peil et al.

[11] 3,936,750
[45] Feb. 3, 1976

[54] AM-FM RECEIVER HAVING IMPROVED BIAS SUPPLY CIRCUIT

[75] Inventors: William Peil, North Syracuse; Robert J. McFadyen, Syracuse, both of N.Y.

[73] Assignee: General Electric Company, Syracuse, N.Y.

[22] Filed: Jan. 20, 1975

[21] Appl. No.: 542,623

Related U.S. Application Data

[63] Continuation-in-part of Ser. No. 435,456, Jan. 22, 1974, abandoned.

[52] U.S. Cl. ............................... 325/315; 325/417
[51] Int. Cl.² ........................................ H04B 1/06
[58] Field of Search ............................ 325/315–318, 325/319, 410, 417, 420, 423, 488, 490–492, 418–419, 422; 330/127, 129, 130–134, 138, 148; 343/205, 206

[56] References Cited
UNITED STATES PATENTS

| | | |
|---|---|---|
| 2,128,642 | 8/1938 | Foster ............................ 325/417 X |
| 2,261,800 | 11/1941 | Freeman ........................... 325/417 |
| 3,454,882 | 7/1969 | Miller ............................ 325/410 X |
| 3,499,981 | 3/1970 | Neal et al. ...................... 325/422 X |
| 3,665,317 | 5/1972 | Crow .................................. 325/319 |
| 3,665,507 | 5/1972 | Peil ................................... 325/315 |
| 3,693,094 | 9/1972 | Kanamaru ......................... 325/422 X |

Primary Examiner—Albert J. Mayer
Assistant Examiner—Robert Hearn

[57] ABSTRACT

The present invention relates to an AM-FM receiver of the superheterodyne variety having a novel bias supply circuit wherein a common filter capacitor may be used for the bias supply, the AGC function in AM operation, and the AFC function in FM operation. The B+ bias is supplied through a controllable current source which adjusts the bias in accordance with the detector output. In the FM mode setting, automatic frequency control of the local oscillator is provided by bias adjustment. In the AM mode setting, automatic gain control of the IF amplifier and of the AM section of the tuner is provided by bias adjustment. The invention has preferred application to integrated circuit fabrication.

20 Claims, 3 Drawing Figures

AM-FM RECEIVER HAVING IMPROVED BIAS SUPPLY CIRCUIT

BACKGROUND OF INVENTION

This is a continuation-in-part of application Ser. No. 435,456 filed Jan. 22, 1974, now abandoned.

1. Field of the Invention

The present invention relates to AM-FM superheterodyne receivers, wherein simplified means are provided for effecting the necessary automatic frequency and gain control functions. The invention also relates to integrated circuit (IC) fabrication of such receivers, wherein increasing complexity on the "chip" and decreasing complexity off the "chip" is favored.

2. Description of the Prior Art

Radio receivers for AM and FM operation have been fabricated for some time using solid state elements. With the advent of integrated circuit devices, the use of "discrete" transistors has tended to decline in favor of integrated circuit devices. Generally, integrated circuit devices, wherein active and passive components are formed in a monolithic semiconductor chip, have been proposed for individual functional components of radio receivers, such as the audio amplifiers, the intermediate frequency amplifiers, etc. One arrangement is known, wherein most of the functions are performed on a single chip. That arrangement is described in U.S. Pat. No. 3,665,507 of William Peil, entitled "Signal Processor for Reception of Amplitude or Frequency Modulated Signals", assigned to the present assignee. In that arrangement, separate filters are provided for AFC, AGC and bias supplies. The present invention employs many principles common to the foregoing application, but departs therefrom particularly in bias supply means and filter requirements for the control functions and in mode conversion.

SUMMARY OF THE INVENTION

Accordingly, it is an object of the present invention to provide an improved AM-FM receiver.

It is a further object of the invention to provide an AM-FM receiver wherein there is provided an improved bias supply means for efficiently performing a multiplicity of control functions within the receiver with minimum filtering.

It is another object of the present invention to provide an AM-FM radio receiver wherein a novel bias supply means and improved filtering means are provided for automatic gain control, automatic frequency control and B+ bias decoupling.

It is a further object of the present invention to provide an AM-FM receiver wherein an improved bias supply means is provided which employs a common filter for automatic gain control, automatic frequency control and B+ bias decoupling.

It is a further object of the present invention to provide an AM-FM receiver wherein improved means are provided for effecting mode conversion.

These and other objects of the present invention are achieved with respect to an AM-FM receiver comprising a tuner for converting received AM and FM signals to two predetermined intermediate frequencies, an FM portion of said tuner having a first terminal for connection to a source of d.c. bias potentials and having a local oscillator energized through said terminal, tunable by bias voltage adjustment; an intermediate frequency amplifier for said two intermediate frequency signals energized through a second terminal for connection to a source of d.c. bias potentials, said amplifier comprising at least one stage of amplification, said amplification being subject to control by bias voltage variation, said gain increasing with increased bias; and an AM-FM detector for said intermediate frequency signals for producing a d.c. voltage for AFC control proportional to the frequency deviation when an FM signal is detected and for producing a d.c. voltage for AGC control proportional to the amplitude when an AM signal is detected.

In accordance with the invention, bias supply means are provided comprising: a primary source of d.c. bias potentials; first means for providing a first d.c. signal with a magnitude that varies as a function of the AM and FM detected outputs, said first means including a first current path whose current embodies said first d.c. signal; second means for providing a second d.c. signal having a first average magnitude for AM mode reception and a second average magnitude for FM mode reception, said second means including a second current path whose current embodies said second d.c. signal; and third means, including a constant current source, responsive to said first and second d.c. signals for producing an output current having a d.c. component that is a function of both said signals, said output current being a source of bias energy for application to the recited terminals of said AM-FM receiver.

Finally, capacitive and mode switching means are provided. In its preferred form, a single capacitor is provided having one terminal coupled to said two terminals to provide filtering action for automatic frequency control and automatic gain control and intermediate frequency amplifier bias decoupling. The mode switching means convert the tuner, bias supply means and AM-FM detector to AM or FM operation.

BRIEF DESCRIPTION OF THE DRAWING

The novel and distinctive features of the invention are set forth in the claims appended to the present application. The invention itself, however, together with further objects and advantages thereof may best be understood by reference to the following description and accompanying drawings, in which:

FIG. 3 is a diagram of a second embodiment of a bias supply circuit that can be alternatively employed in the circuit of FIG. 2.

DESCRIPTION OF A PREFERRED EMBODIMENT

Figure 1:
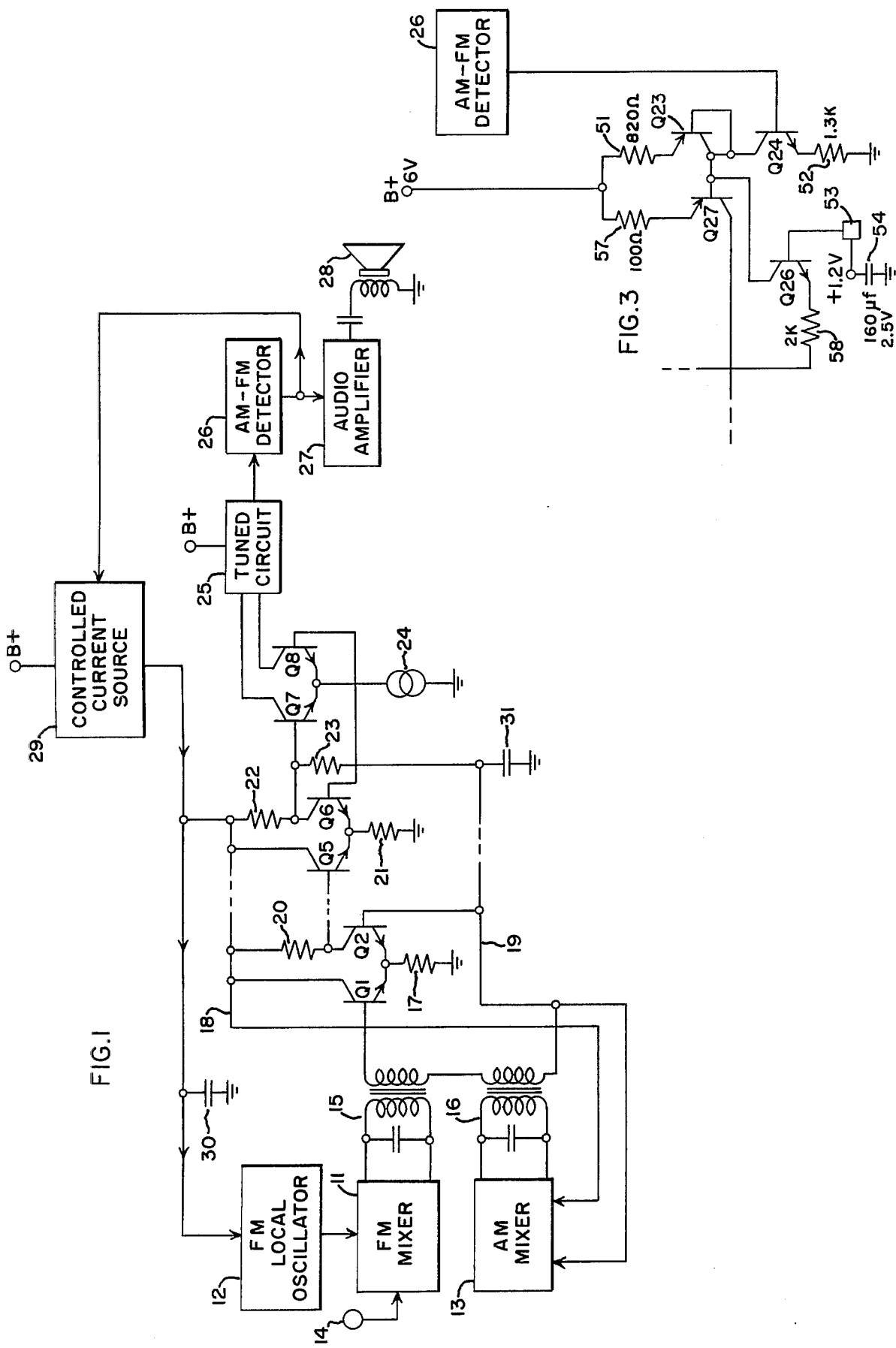
FIG. 1 is a simplified drawing, primarily in block diagram form, of an AM-FM receiver embodying the invention.

A radio receiver embodying the invention is shown in simplified block diagram form in FIG. 1. The radio receiver takes the general form of a superheterodyne receiver and is intended for AM-FM operation. Of particular interest are those features directed to automatic frequency and gain control filtering.

Signal conversion to a pair of fixed intermediate frequencies is achieved in the blocks 11, 12 and 13 comprising the "front end" or tuner of the receiver. The FM mixer is shown with an input connection 14 to which FM signals may be supplied, typically from a whip antenna, while the AM mixer is shown without external provision for the reception of AM signals.

Normally, the AM mixer depends upon the pick-up of a ferrite element contained within the unit. The FM mixer 11 receives local oscillations from an FM local oscillator 12 and produces an output at a fixed intermediate frequency (10.7 MHz), station selection occuring in the filter 15 connected to the output thereof. The AM mixer 13, which also includes an oscillator, produces an output at a fixed intermediate frequency of 455 KHz. The AM output is applied to the intermediate frequency filter 16. The AM mixer is provided with a pair of AGC connections to the two busses 18 and 19, whose functions will be described in greater detail below. The tuner is provided with means, not shown, for AM or FM mode operation in conjunction with other mode selection elements of the radio receiver.

The filtered IF frequency output from the FM filter 15 or the AM filter 16, is applied to the input of the IF amplifier whose connections will now be described.

The IF amplifier is of plural stages and has substantial d.c. feedback. It comprises the differentially connected transistor pairs Q1, Q2; Q5, Q6; and Q7, Q8. The input signal is applied to the base of transistor Q1 having its emitter coupled to ground through load resistance 17 and its collector coupled to bus 18 which provides B+ bias. The bus 18, as will be described, is also used to provide automatic gain control of the individual stages of the IF amplifier. The output of Q1, which appears at its emitter and across the load resistances 17, is applied to the emitter of Q2. The base of Q2 is coupled to a second control bus 19 used to provide balanced biasing to the differential stages and for secondary AGC. The bus 19 is by-passed to ground by a filter capacitor 31. The collector of Q2 is coupled through a load resistance 20 to the bus 18. With another stage of IF amplification normally intervening, the signal output from the collector of transistor Q2 is then applied to the transistor Q5 in the next to last stage of IF amplification. This stage has the same configuration as the first stage and is also subject to automatic gain control. In particular, the input signal is applied to the base of Q5, the collector is returned to the bus 18 for B+ bias and for gain control and the emitters of Q5 and Q6 are connected together and led to ground through a load resistance 21. Signal coupling from Q5 and Q6 is achieved by this interconnection. The base of Q6 is led to the secondary AGC bus 19, and the collector of Q6 is led through a load resistance 22 to the bus 18.

The IF amplifier is provided with feedback for reducing drift; a d.c. feedback resistance 23 coupled between the collector and base electrode of Q6. The feedback resistance 23 is coupled to the secondary AGC bus 19, which is coupled to the base of the second transistor (Q2) in the initial IF stage, and similarly to the second transistor of any intermediate stages. The d.c. connection causes the bus 19 to have a voltage which varies with the d.c. voltage present on the control bus 18, and provides a convenient means of achieving additional automatic gain control in the tuner in the AM mode. By these connections, amplified output signals at one of the two IF frequencies appear at the collector of Q6 and are applied to a final stage of IF amplification.

The final IF stage employs the transistors Q7, Q8. They are differentially connected, having the base of Q7 coupled to the collector of Q6 and the base of Q8 being coupled to the secondary AGC bus 19. The emitters of Q7, Q8 are connected together and led through a current source 24 to ground. The output appearing at one (Q8) of the collectors Q7, Q8 containing either FM or AM signals at their respective IF frequencies, is then applied to a tuned circuit 25 suitable for final filtering and signal coupling to the AM-FM detector 26.

The AM-FM detector 26 is designed to provide detection for either an AM or FM signal dependent upon the mode setting and produces an output voltage containing both the audio and unfiltered intermediate frequency components. In particular, in the AM mode, a d.c. output voltage appears which is proportional to the AM carrier while in the FM mode an output voltage appears which is proportional to the FM error in center tuning.

The detected output voltage from 26 is a.c. coupled to the audio amplifier 27 after filtering to remove high frequency components. The amplifier then produces an output for driving the capacitively coupled loudspeaker 28. The detected output from 26 is combined with a selectable d.c. level by means internal to block 26 and the controllable current source 29 responds to both. The current source 29 then supplies an "adjustable" current to the bus 18 as a function of the detected output quantities. The d.c. level selection is tied in with mode selection, being smaller for AM operation (1.65 volts) and higher (2.4 volts) for FM operation. Since the detected signal is superimposed on these settings, two ranges of voltages will be produced on the bus 18. As will be shown in detail below, the AM voltage setting is selected to be one in which the IF amplifier stages exhibit a substantial gain variation. The FM voltage range setting produces a higher IF gain, but with some gain variation due to the d.c. changes which are proportional to the AFC voltage. Since these changes are relatively small and occur only during pull-in (or out) of the AFC loop, the variation is not objectionable. The voltage setting for FM is accordingly one which provides the requisite variation in B+ to provide automatic frequency control action of the local FM oscillator.

The overall control functions in AM and FM modes of operation may now be summarized. The bus 18 performs the five functions of providing B+ bias for the FM mixer and local oscillator, B+ biasing for the IF amplifier stages (Q1, Q2; Q5, Q6), automatic frequency control of the FM local oscillator, automatic gain control of the IF stages on AM and, finally, an automatic gain control of the AM mixer. The secondary AGC bus 19, while primarily for assuring d.c. stability of the IF amplifier, also provides for additional automatic gain control of the AM mixer.

The consolidation of functions on the bus 18 permits a single capacitor coupled to bus 18 to perform a plurality of functions. Capacitor 30 (400 $\mu$f, 4 v) is that capacitor. Capacitor 30 has a value selected to provide the requisite B+ decoupling of a.c. components for the IF stages connected thereto and provides AGC and AFC filtering. Its value is selected to provide the requisite AGC time constant for AM and the requisite AFC time constant for FM. The AM and FM time constants are normally chosen to have approximately the same value, the values being suitable for the dial tuning process, wherein time constants of a half of a second or so are customary. The time constants are thus adequate for IF decoupling and for ripple filtering.

Figure 2:
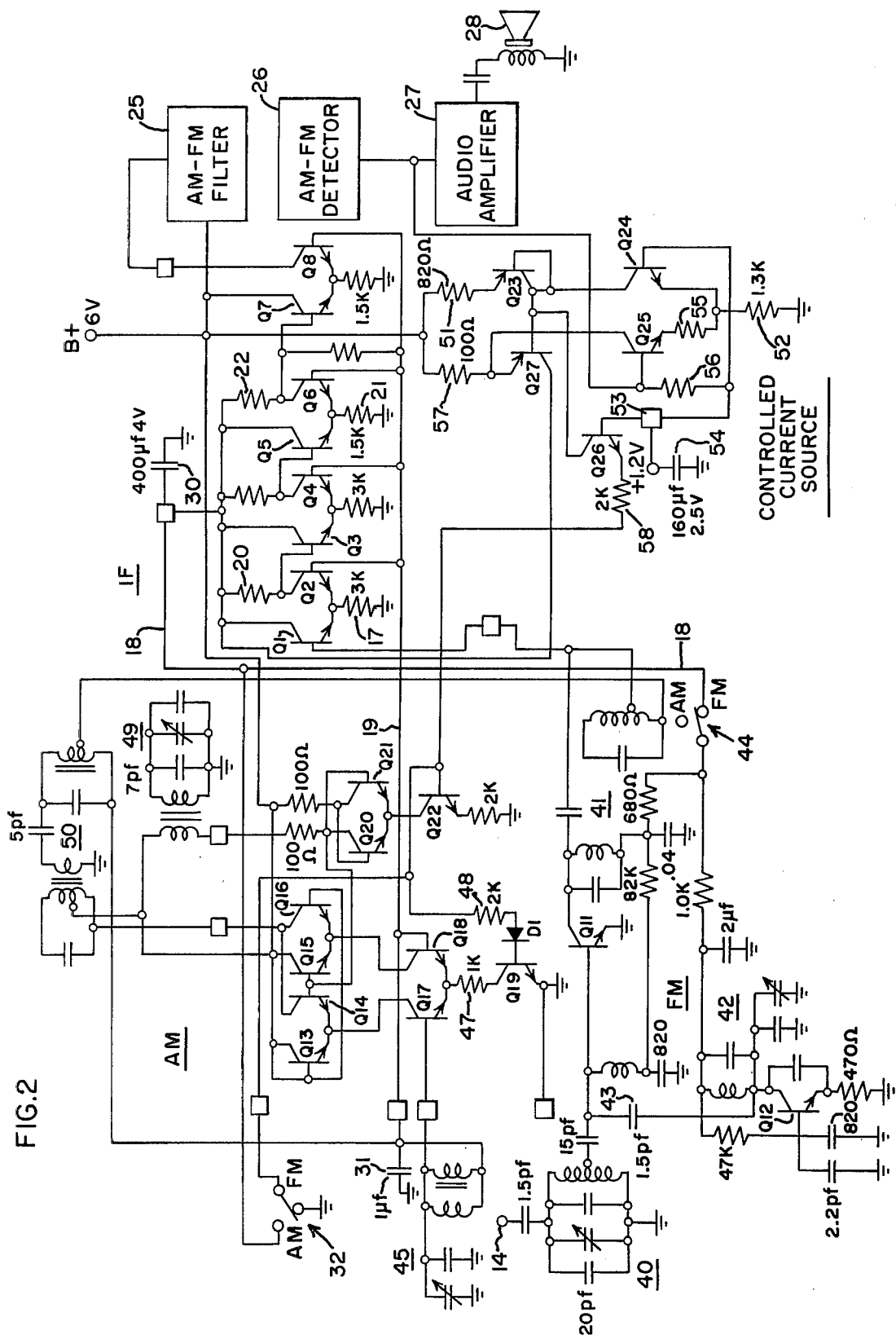
FIG. 2 is a diagram of the same embodiment having an essentially complete circuit diagram, omitting only the AM-FM detector and the audio amplifier.

The practical embodiment is illustrated in greater detail in FIG. 2. The arrangement is adapted for integrated circuit fabrication. The partitioning places the AM-FM tuner, the filters for signal separation and for the control functions off the chips. The balance of the receiver, including the IF gain strip, the second detector, the audio amplifier, and the adjustable current source, are on the chip. For brevity, the details of the AM-FM filter 25, the AM-FM detector 26, and the audio amplifier have not been indicated. The AM-FM detector may take several forms. A suitable form is that illustrated in the previously cited U.S. Pat. No. 3,665,507 of Peil.

Turning now to FIG. 2, the FM mixer is shown at the lower lefthand portion of the drawing. The FM signals are coupled to the input terminal 14, coupled through input tuned circuit 40 to the base of mixer transistor Q11. The emitter of Q11 is grounded, and the collector is coupled through an output tuned circuit 41 to the base of IF input transistor Q1.

The signals appearing at the base of the mixer Q11 are mixed with oscillations derived from the FM local oscillator. The FM local oscillator comprises the transistor Q12, coupled in emitter common configuration, and the tank circuit 42 coupled to the collector thereof. Oscillations from the local oscillator are coupled through capacitor 43 to the base of Q11.

FM mode selection is achieved by the switching means 44. In the AM position, the means 44 removes the B+ bias supplied by bus 18 from both the mixer transistor Q11 and the local oscillator transistor Q12. In the FM position, the 2.4 volts on bus 18 (during FM) is applied to the collector of the mixer Q11 through the primary of the tuned output circuit 41 and through the tank circuit 42 to the collector of local oscillator Q12. Suitable base bias for both Q11 and Q12 are also provided. The detector-local oscillator configuration is essentially conventional except that the circuit frequency is allowed to remain B+ bias dependent and no effort has been made to remove that dependency. The circuit values indicated on the figure provide for adequately sensitive AGC operation to satisfy conventional home receiver requirements.

The AM detector is illustrated at the upper lefthand portion of the drawing. It comprises a four quadrant multiplier, having differentially paired transistors Q13, Q14; Q15, Q16 in the upper rank and Q17, Q18 in the lower rank. The AM signal derived from the input tuned circuit is applied to the base of one lower rank transistor Q17. The other base of the other lower rank transistor is coupled to the secondary AGC bus 19 and by-passed to ground by capacitor 31. The paired emitters of Q17, Q18 are returned to ground through a current source under delayed automatic gain control. This current source comprises the transistor Q19, diode D1, and resistances 47 and 48. The transistor Q19 has its emitter grounded, its base coupled through diode D1, and resistance 48 to the FM terminal of switch 32. In AM operation, the switch couples 48 to the AGC bus 18. The collector of Q19 is coupled through resistance 47 to the emitter of Q17, Q18. This current source thus provides a measure of additional AGC to the AM mixer, once the delay interjected by the drop in diode D1 is exceeded.

Continuing with the upper rank of the AM mixer, the paired transistors Q13, Q14 and Q15, Q16 receive AM signal injection into their paired emitters from the lower rank pair Q17, Q18 and local oscillator injection into their bases. The local oscillator comprises a pair of differentially connected transistors Q20, Q21, whose emitters are coupled to ground through current source Q22 and whose collectors are returned to the 6 volt B+ bus through small (100 ohm) resistances. The transistors Q20, Q21 are cross-coupled collector to base, and one collector (Q20) is coupled to the oscillating tank circuit 49. The oscillator output coupled from Q20 to the bases of upper rank transistors Q14, Q15 where mixing takes place. The mixer output is derived from the collector of Q16, and applied through tuned circuit 50 to the base of Q1 (the circuit path including the FM tuned circuit 41).

The mode switch 32 controls the AM section of the tuner. The switch 32 is a single pole, double throw switch, having one terminal grounded and the other coupled to the bus 18. The pole is coupled through resistance 48 to the diode D1. Operation of the switch 32 to the ground position, back biases the diode D1 and cuts off current injection from current source Q19, thus cutting off all current to the AM mixer. Operation of the switch 32 to the other position, on the other hand, permits current to flow into the current source Q19 and activates the AM section of the tuner. Mode switches 32 and 44 operate in synchronism.

The IF amplifier has been previously detailed save for the addition of a stage of amplification.

The controlled current source for providing the bias energy is in the lower righthand portion of FIG. 2. It comprises transistors Q23 to Q27, and resistive and capacitive components 51 to 58. It comprises an adjustable current reference and a current source controlled by that reference.

The current source comprises in part a diode connected transistor Q23, having its emitter returned to the B+ bus (+6 volts) through resistance 51. The current path through Q23 is completed to ground through two paths of the current reference. One path is through Q24, whose current is in turn controlled through Q25. The emitter of Q24 is returned to ground through resistance 52 and its base is held at a constant value of +1.2 volts by connection to a bias source coupled to the pad 53. The pad 53 is also provided with a large (160 µf) filter capacitor for hum reduction and signal decoupling, associated with the audio amplifier.

The current flow in Q24, as noted, is adjusted by Q25 in response to the detector output. The output of the AM-FM detector is coupled to the base of Q25, whose emitter is led through 600 ohm resistance 55 to the emitter load resistance of Q24. The base of Q25 is returned through resistance 56 to +1.2 volts at pad 53. The collector of Q25 is coupled through a load resistance 57 to the positive bias source. The detected signal from the detector 26 is thus coupled to the base of Q25, where by shared emitter load coupling, a signal induced change is produced in emitter current in Q24, and a corresponding change produced in the reference current in Q23. This mechanism operates in both the AM and FM settings to cause a change in the current flow in current reference Q23. The presence of the resistance 55 in the emitter path of Q25 tends to cause an initially higher current in Q24, by reducing the Veb in Q25 relative to Q24. This raises the minimum reference current.

The mode switching adjustment of Q23 from a low gain setting for AM to a high gain setting for FM is provided by the transistor Q26. The collector of Q26 is coupled to the base-collector of Q23, and its base is returned to the +1.2 volt bias at pad 53. The emitter of Q26 is led through resistance 58 to the pole of the FM mode switch 32. Earthing the mode switch for FM mode operation causes Q26 to conduct and steps the current in Q23 to a new plateau thereby raising the voltage on bus 18 by about three-quarters of a volt. Switching the pole of 32 to the AM position turns off Q26, and reduces the current to the prior vallue. In either position of the mode switch 32, the current in Q23 is controlled by the detected output, but over a different current range.

The final element in the current source is the transistor Q27 whose emitter is coupled through resistance 57 to the positive bias source whose base is coupled to the base-collector of Q23, and whose collector is coupled to the bus 18. The input junction of Q27 is thus coupled in shunt with the input junction of Q23 with resistances 57 and 51 scaled to produce equal voltage drops and to produce equal junction potentials. Under strong AGC conditions, Q25 serves to reduce further the current in Q27, and augments the control function. Save for current removed by Q25, which augments the drop in resistance 57, the current ratios between Q23 and Q27 are dependent on their relative active region areas. The geometry of Q27 is scaled to be 8 times that of Q23. Accordingly, the current in Q27 is about 8 times that in the reference Q23.

In either AM or FM setting, the current available to the bus 18 flows through Q27, and is made dependent on the detected output and mode setting. As earlier noted, the normal B+ bias on bus 18 for AM operation is about 1.65 volts, and that for FM operation is 2.4 volts.

An alternative embodiment of the controlled current source for providing bias energy is shown in FIG. 3. It may be seen that the circuit is the same as that shown in FIG. 2 with the exception that the detected output from AM-FM detector 26 is coupled directly to the base of Q24, and the transistor Q25 and resistors 55 and 56 are deleted for further circuit simplification. The circuit functions similarly to the previous embodiment, but on AM utilizes a detected output from AM-FM detector 26 that is a negative going d.c. voltage with increasing signal strength rather than a positive going d.c. voltage with increasing signal strength, as is the case in the embodiment of FIG. 2.

While the invention may take other forms, the foregoing design is particularly economical of outboarded components, and thus of overall cost. Assuming like performance requirements, the cost of a completed AM-FM radio receiver using a single chip with the indicated partioning is substantially less than the costs in a non-integrated format.

What I claim as new and desire to secure by Letters Patent of the U.S. is:

1. In a superheterodyne radio receiver in the integrated circuit format, the combination comprising:
   a. a tuner for converting received AM and FM signals to two predetermined intermediate frequencies, an FM portion of said tuner having a first terminal for connection to a source of d.c. bias potentials and having a local oscillator energized through said terminal, tunable by bias voltage adjustment,
   b. an intermediate frequency amplifier for said two intermediate frequency signals energized through a second terminal for connection to a source of d.c. bias potentials, said amplifier comprising at least one stage of amplification, said amplification being subject to control by bias variation, increasing with increased bias,
   c. an AM-FM detector for said intermediate frequency signals for producing a d.c. voltage for automatic frequency control proportional to the error in center tuning when an FM signal is detected and for producing a d.c. voltage for automatic gain control proportional to the amplitude when an AM signal is detected,
   d. bias supply means comprising:
      1. means for deriving energy from a primary source of d.c. bias potentials,
      2. means coupled to said energy deriving means for controlling the potential applied to said two terminals, said control means having a first control for establishing a lower average bias for AM operation and a higher average bias for FM operation and a second control responsive to said detector output for controlling said bias about said averages as a function of detector output,
   e. capacitive means coupled to said terminals to provide filtering action for automatic frequency control and automatic gain control, and
   f. mode switching means for converting said tuner, said bias supply means, and said AM-FM detector to AM or FM operation.

2. The combination as set forth in claim 1, wherein said first and second terminals are joined and a common filter capacitor is provided for automatic frequency control, automatic gain control and for B+ bias decoupling of a.c. components.

3. The combination as set forth in claim 2 wherein said control means comprises a controllable current source, which supplies current in response to said first and second controls.

4. A bias supply circuit for a radio receiver capable of being selectively operated for either AM or FM mode reception, comprising:
   a. first means for providing a first d.c. signal having a magnitude that varies as a function of the AM or FM detected outputs,
   b. second means for providing a second d.c. signal having a first average magnitude when the AM mode is selected and a second average magnitude when the FM mode is selected, and
   c. third means responsive to said first and second d.c. signals for producing an output current having a d.c. component that is a function of both said signals, said output current being a source of bias energy for application to other portions of the receiver.

5. A bias supply circuit as in claim 4 wherein the d.c. component of the output current has a dynamic characteristic which is related to said first d.c. signal, and a static characteristic which is related to said second d.c. signal.

6. A bias supply circuit as in claim 5 wherein said second d.c. signal has a greater magnitude in the case of FM mode reception than in the case of AM mode reception.

7. A bias supply circuit as in claim 6 wherein said first means includes a first current path whose current embodies said first d.c. signal, said second means includes a second current path whose current embodies said second d.c. signal, and said third means includes a third current path connected in combination with said first and second current paths so that the output current produced by said third means is proportional to the sum of the currents in said first and second current paths.

8. A bias supply circuit for a radio receiver capable of being selectively operated for either AM or FM mode reception, comprising:
   a. a first current path, the current in which is controlled so as to have a magnitude that varies as a function of the AM or FM detected output signals of the receiver,
   b. a second current path, the current in which is controlled so as to assume one of two different average magnitudes as a function of the selected mode of reception, and
   c. a current source connected in combination with said first and second current paths for producing an output current that is proportional to the sum of the currents in said first and second current paths, said output current being a source of bias energy for application to other portions of the radio receiver so as to control the operation thereof as a function of the detected output signals and mode of reception.

9. A bias supply circuit as in claim 8 which includes first means responsive to the d.c. components of the detected output signals for effecting control of the current in said first current path, whereby there is provided an automatic gain control during AM reception and an automatic frequency control during FM reception.

10. A bias supply circuit as in claim 9 which includes second means responsive to the selected mode of reception for effecting control of the current in said second current path.

11. A bias supply circuit as in claim 10 which includes capacitive means coupled to said current source for substantially filtering out a.c. components in the output current.

12. A bias supply circuit as in claim 8 wherein:
   a. said first current path includes a first transistor,
   b. said second current path includes a second transistor,
   c. said current source includes third and fourth transistors, one end of the emitter-collector circuits of said first and second transistors forming a junction through which they are each serially connected with the emitter-collector circuit of said third transistor so that currents conducted by said first and second transistors are summed in said third transistor, said fourth transistor connected to said third transistor so as to provide amplification of the current in said third transistor, giving rise to said output current.

13. A bias supply circuit as in claim 12 wherein said first and second transistors are of NPN type, said third and fourth transistors of PNP type, the emitter of said third and fourth transistors connected through first and second resistors, respectively, to a source of reference voltage, the emitter of said first transistor connected through a further resistor to ground, said third transistor having its base and collector joined together at said junction so as to function as a diode, said junction being further connected to the collectors of said first and second transistors and to the base of said fourth transistor.

14. A bias supply circuit as in claim 13 wherein the active region areas of said third and fourth transistors are substantially in direct proportion to their current carrying capacities and the values of said first and second resistors are substantially in inverse proportion to said current carrying capacities.

15. For use in a radio receiver capable of being selectively operated for either AM or FM mode reception, the combination comprising:
   a. an AM tuner for converting received AM signals to a first predetermined intermediate frequency and having a first terminal for providing access to a source of bias energy that provides automatic gain control of said tuner,
   b. an intermediate frequency amplifier for said first predetermined intermediate frequency and for a second predetermined intermediate frequency of converted FM signals energized through a second terminal for providing access to a source of bias energy that provides gain control of said amplifier,
   c. an AM-FM detector for said intermediate frequency signals for producing a d.c. voltage for automatic frequency control proportional to the error in center tuning when an FM signal is detected and for producing a d.c. voltage for automatic gain control proportional to the amplitude when an AM signal is detected,
   d. bias supply means including,
      1. first means for providing a first d.c. signal having a magnitude that varies as a function of the AM or FM detected outputs,
      2. second means for providing a second d.c. signal having a first average magnitude when the AM mode is selected and a second average magnitude when the FM mode is selected, and
      3. third means responsive to said first and second d.c. signals for producing an output current having a d.c. component that is a function of both said signals, said output current being a source of bias energy for application to said first and second terminals.

16. The combination of claim 15 wherein said first and second terminals are joined together and also provide access of said source of bias energy to an FM tuner that is within said radio receiver for providing automatic frequency control of said FM tuner.

17. The combination of claim 16 which further includes capacitive means coupled to the junction of said first and second terminals for substantially filtering out a.c. components in the output current.

18. The combination of claim 17 which further includes mode switching means for converting said AM and FM tuners, said bias energy source and said AM-FM detector to AM or FM operation.

19. For use in a radio receiver capable of being selectively operated for either AM or FM reception, the combination comprising:
   a. a tuner for converting received AM and FM signals to two predetermined intermediate frequencies, an FM portion of said tuner having a first terminal for connection to a source of bias energy and having a local oscillator energized through said terminal, tunable by bias voltage adjustment,
   b. an AM portion of said tuner having a second terminal for connection to a source of bias energy and having a local oscillator controlled through said second terminal,
   c. an intermediate frequency amplifier for said two intermediate frequency signals energized through a third terminal for connection to a source of bias energy, said amplifier comprising at least one stage of amplification, said amplification being subject to control by bias variation, increasing with increased bias, d. an AM-FM detector for said intermediate frequency signals for producing a d.c. voltage for automatic frequency control proportional to the error in center tuning when an FM signal is detected and for producing a d.c. voltage for automatic gain control proportional to the amplitude when an AM signal is detected,
e. bias supply means including,
  1. a first current path,
  2. first means for controlling the current in said first current path as a function of the detected output signals of the receiver,
  3. a second current path,
  4. second means for controlling the current in said second current path as a function of the mode of reception, to exhibit a first average magnitude during AM reception and a second average magnitude during FM reception,
  5. a current source connected in combination with said first and second current paths for producing an output current that is proportional to the sum of the currents in said first and second current paths, said output current acting to supply bias energy to said tuner and intermediate frequency amplifier, and
f. coupling means for coupling said output current to said first, second and third terminals for providing automatic gain control and automatic frequency control of the tuner and intermediate frequency amplifier.

20. The combination of claim 19 wherein said coupling means includes capacitive means to substantially filter out the a.c. components in the output current.

* * * * *